United States Patent
Huang et al.

(10) Patent No.: US 10,867,847 B2
(45) Date of Patent: Dec. 15, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Hsin-Yen Huang, New Taipei (TW); Kai-Fang Cheng, Taoyuan (TW); Chi-Lin Teng, Taichung (TW); Shao-Kuan Lee, Kaohsiung (TW); Hai-Ching Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/049,187

(22) Filed: Jul. 30, 2018

(65) Prior Publication Data

US 2018/0350669 A1    Dec. 6, 2018

Related U.S. Application Data

(62) Division of application No. 15/063,358, filed on Mar. 7, 2016, now Pat. No. 10,211,097.

(Continued)

(51) Int. Cl.
*H01L 21/768* (2006.01)
*H01L 23/532* (2006.01)
*H01L 23/522* (2006.01)

(52) U.S. Cl.
CPC .... *H01L 21/76865* (2013.01); *H01L 21/7685* (2013.01); *H01L 21/76813* (2013.01);

(Continued)

(58) Field of Classification Search
CPC ......... H01L 21/76865; H01L 21/76832; H01L 21/76829; H01L 21/76813;
(Continued)

(56) References Cited

U.S. PATENT DOCUMENTS 7,858,510 B1 * 12/2010 Banerji ............... C23C 16/0227
257/E21.269
8,470,708 B2   6/2013 Shih et al.
(Continued)

FOREIGN PATENT DOCUMENTS

CN     1767171         5/2006
CN     101859727 A    10/2010
TW     200506090 A     2/2005

OTHER PUBLICATIONS

King, "Dielectric Barrier, Etch Stop, and Metal Capping Materials for State of the Art and Beyond Metal Interconnect"—ECS Journal of Solid State Science and Technology, 4(1) N3029-N3047 (2015) (Year: 2015).*

(Continued)

*Primary Examiner* — Syed I Gheyas
(74) *Attorney, Agent, or Firm* — McDermott Will & Emery LLP

(57) ABSTRACT

A semiconductor device includes a first metal wiring layer, an interlayer insulating layer formed over the first metal layer, a second metal wiring structure embedded in the interlayer dielectric layer and connected to the first metal wiring layer, and an etch-stop layer disposed between the first metal wiring and the first interlayer dielectric layer. The etch-stop layer includes one or more sub-layers. The etch-stop layer includes a first sub-layer made of an aluminum-based insulating material, hafnium oxide, zirconium oxide or titanium oxide.

20 Claims, 10 Drawing Sheets

Related U.S. Application Data

(60) Provisional application No. 62/273,366, filed on Dec. 30, 2015.

(52) U.S. Cl.
CPC .. *H01L 21/76829* (2013.01); *H01L 21/76832* (2013.01); *H01L 21/76846* (2013.01); *H01L 21/76877* (2013.01); *H01L 23/5329* (2013.01); *H01L 23/53295* (2013.01); *H01L 23/5226* (2013.01); *H01L 23/53238* (2013.01)

(58) Field of Classification Search
CPC ......... H01L 23/53295; H01L 21/76846; H01L 23/5329; H01L 21/76877; H01L 21/7685; H01L 23/53238; H01L 23/5226
See application file for complete search history.

(56) References Cited

U.S. PATENT DOCUMENTS

| | | | |
|---|---|---|---|
| 8,759,917 | B2 | 6/2014 | Park et al. |
| 2004/0253811 | A1 | 12/2004 | Lee et al. |
| 2006/0084275 | A1* | 4/2006 | You .................. H01L 21/31116 438/704 |
| 2007/0290347 | A1* | 12/2007 | Dostalik ........... H01L 21/02126 257/758 |
| 2009/0194845 | A1 | 8/2009 | Werner et al. |
| 2010/0252930 | A1* | 10/2010 | Liao .................. H01L 21/76807 257/762 |
| 2014/0070320 | A1* | 3/2014 | Mukherjee ........ H01L 21/82345 257/368 |
| 2015/0255339 | A1 | 9/2015 | Zhang et al. |
| 2016/0343660 | A1* | 11/2016 | Kim .................... H01L 23/5226 |
| 2017/0062209 | A1* | 3/2017 | Shiba ................ H01L 21/02178 |
| 2017/0103914 | A1* | 4/2017 | Damjanovic ..... H01L 21/76831 |

OTHER PUBLICATIONS

Office Action issued in corresponding Taiwanese Patent Application No. 105138811, dated Nov. 6, 2017.

Non-Final Office Action dated Jan. 25, 2018 issued in U.S. Appl. No. 15/063,358 (18 pages).

Final Office Action dated Jun. 21, 2017 issued in U.S. Appl. No. 15/063,358 (17 pages).

Non-Final Office Action dated Jan. 26, 2017 issued in U.S. Appl. No. 15/063,358 (13 pages).

Non-Final Office Action dated Oct. 10, 2016 issued in U.S. Appl. No. 15/063,358 (7 pages).

* cited by examiner

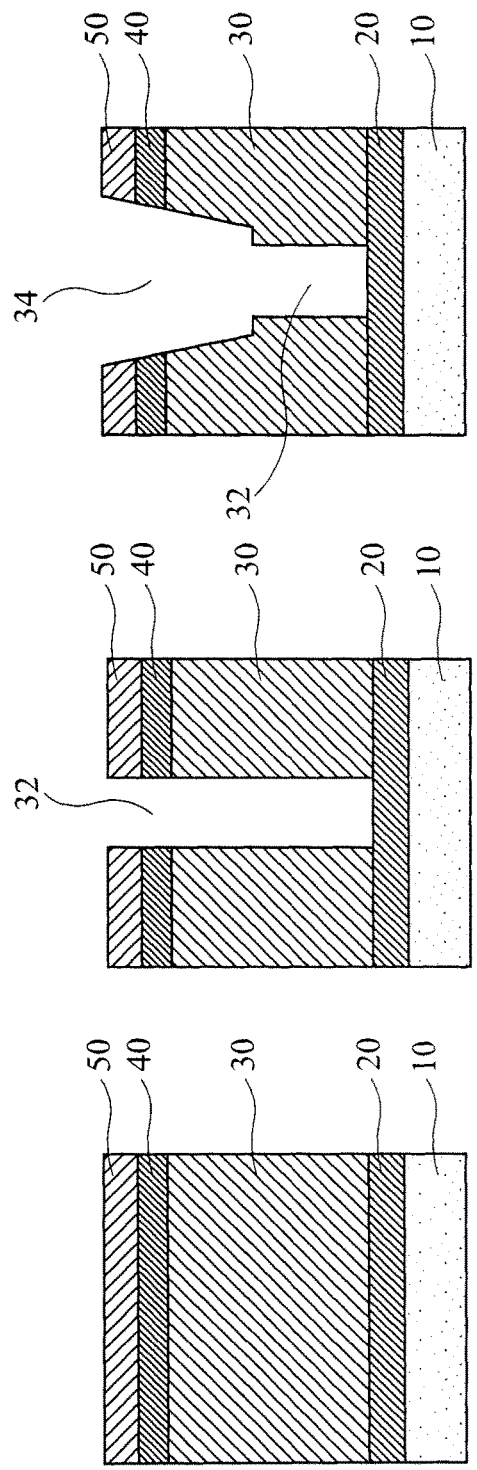
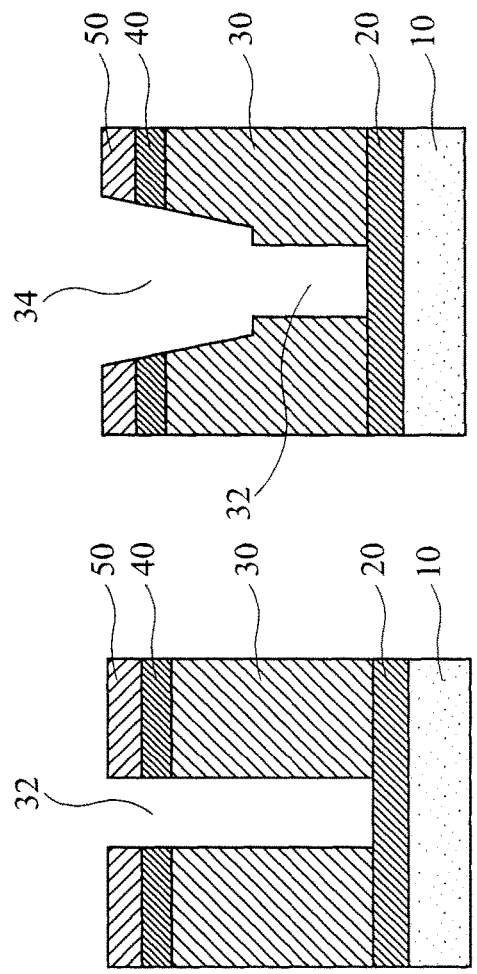
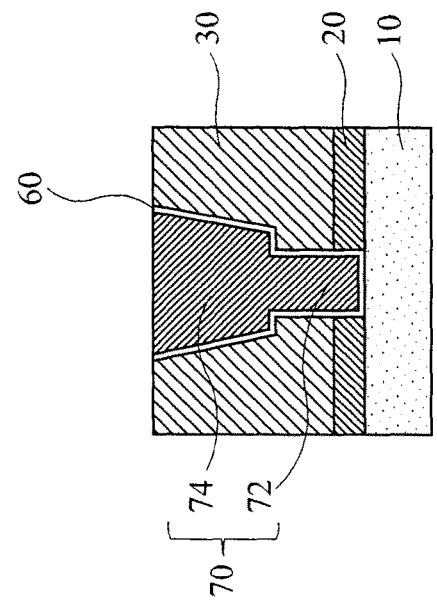
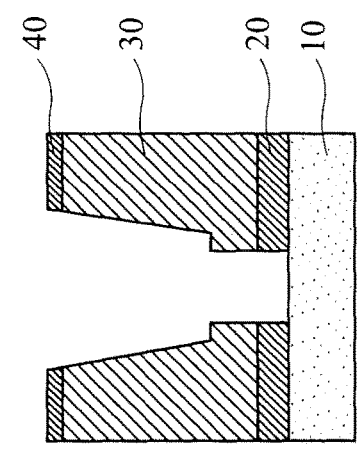
FIG. 1A  FIG. 1B  FIG. 1C  FIG. 1D  FIG. 1E

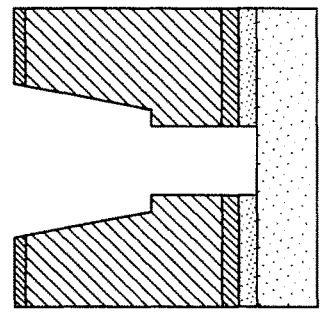
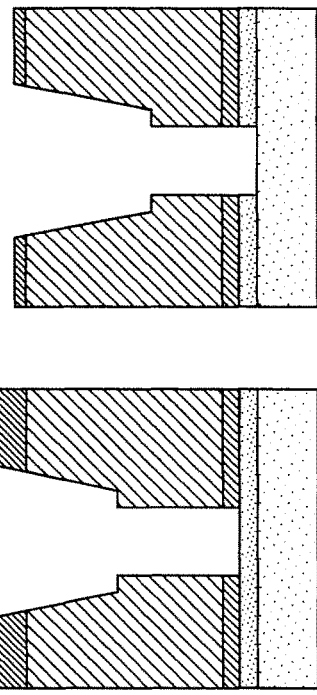
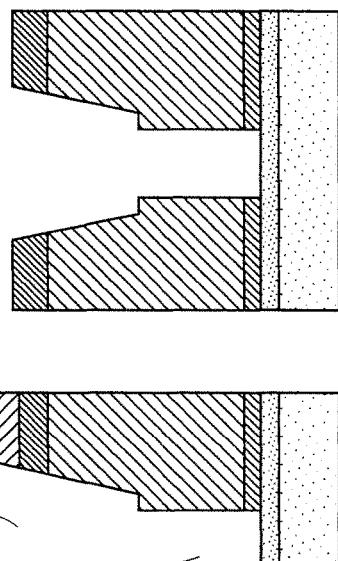
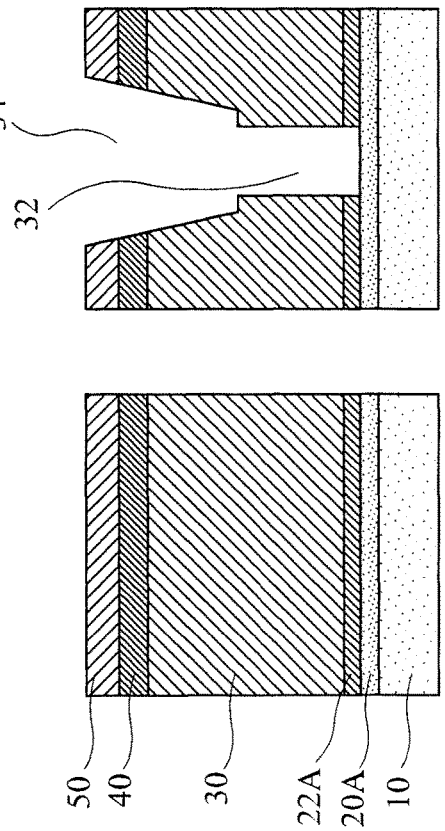
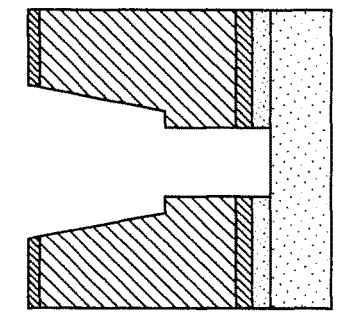
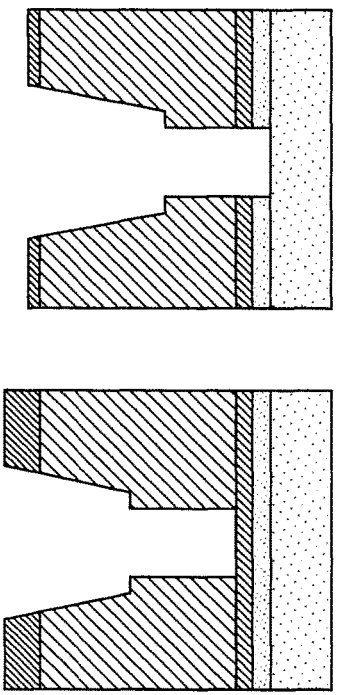
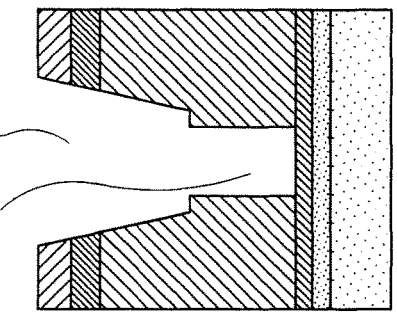
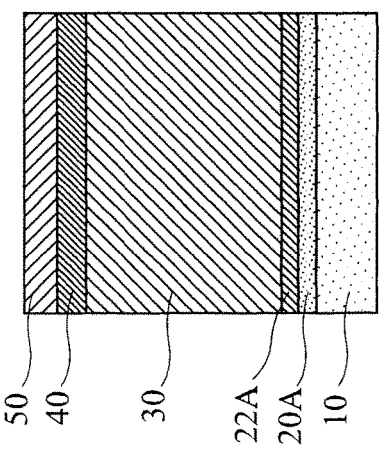

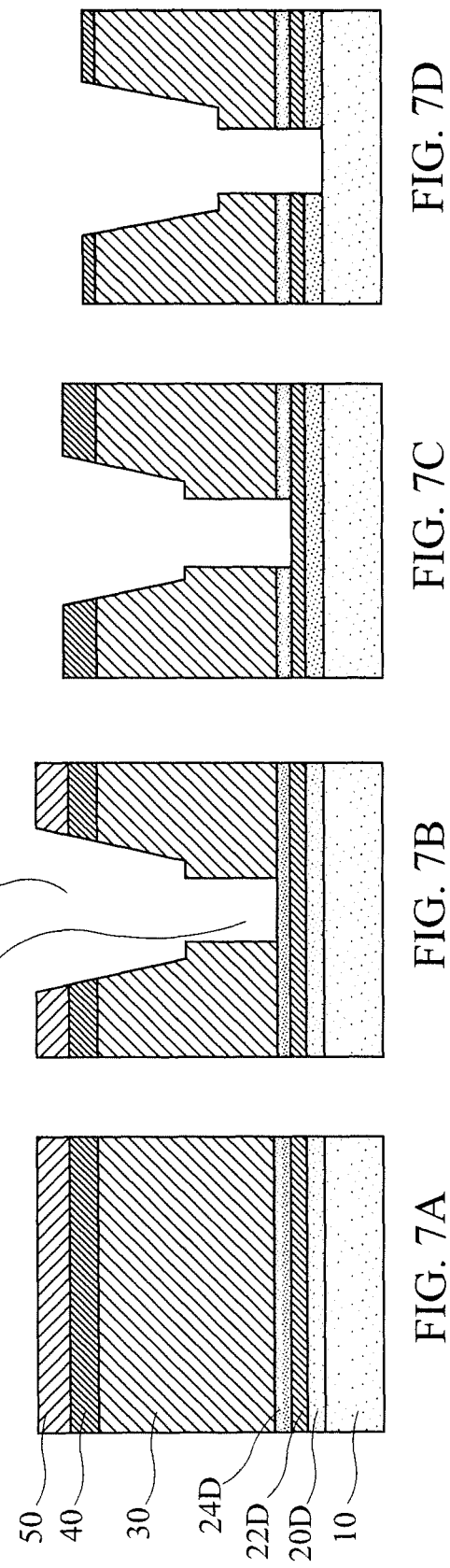

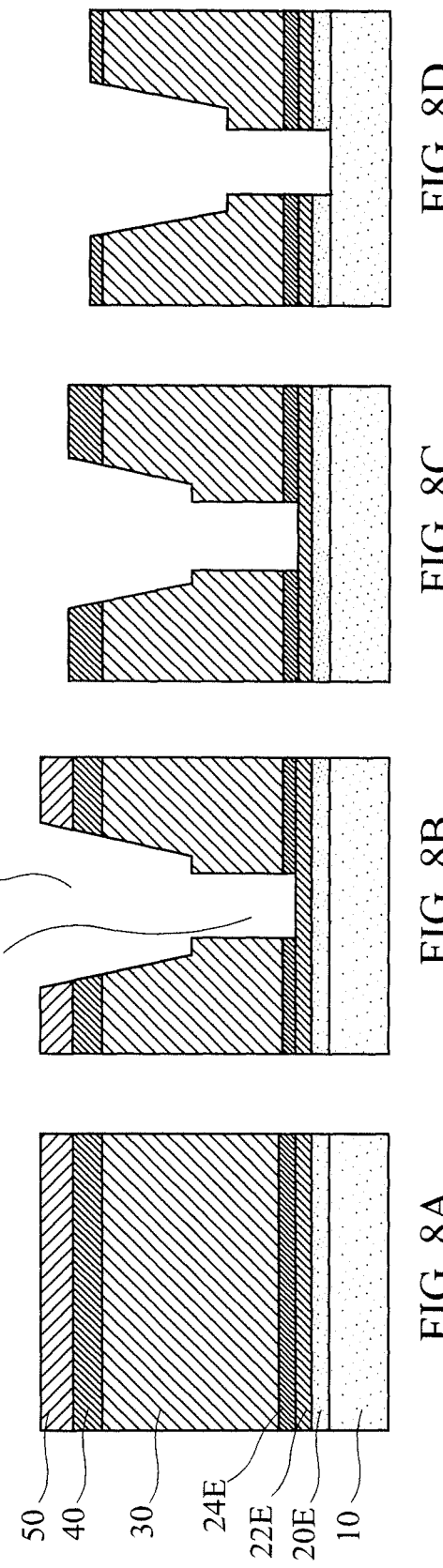

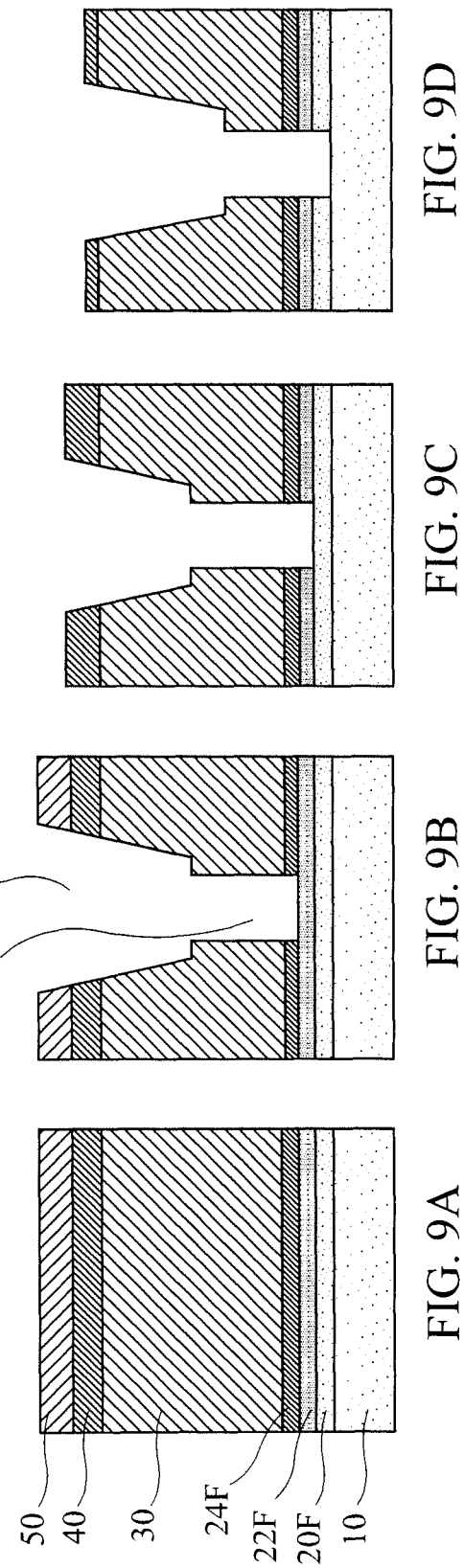

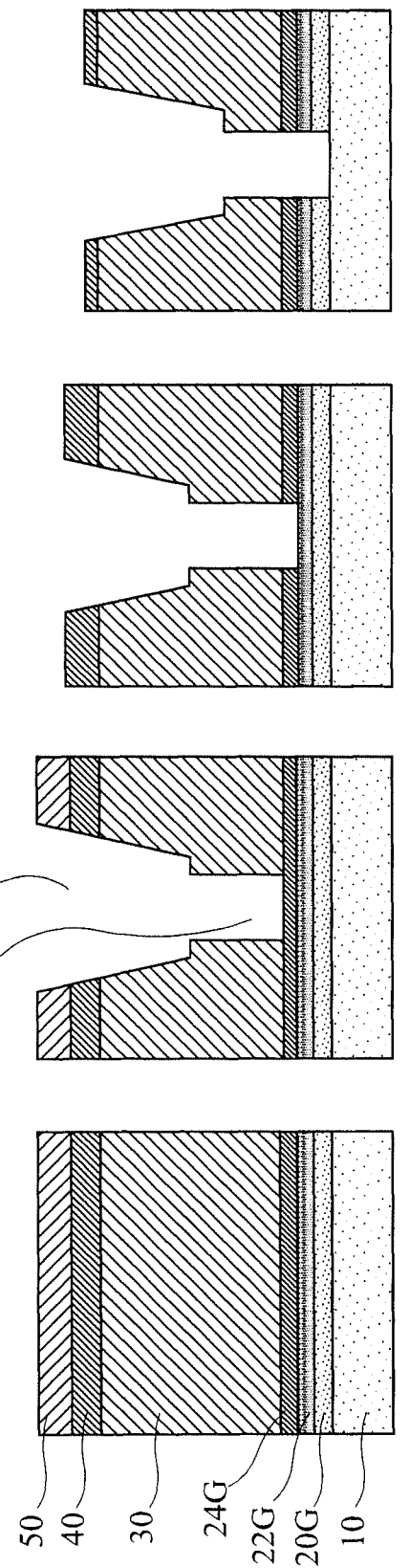

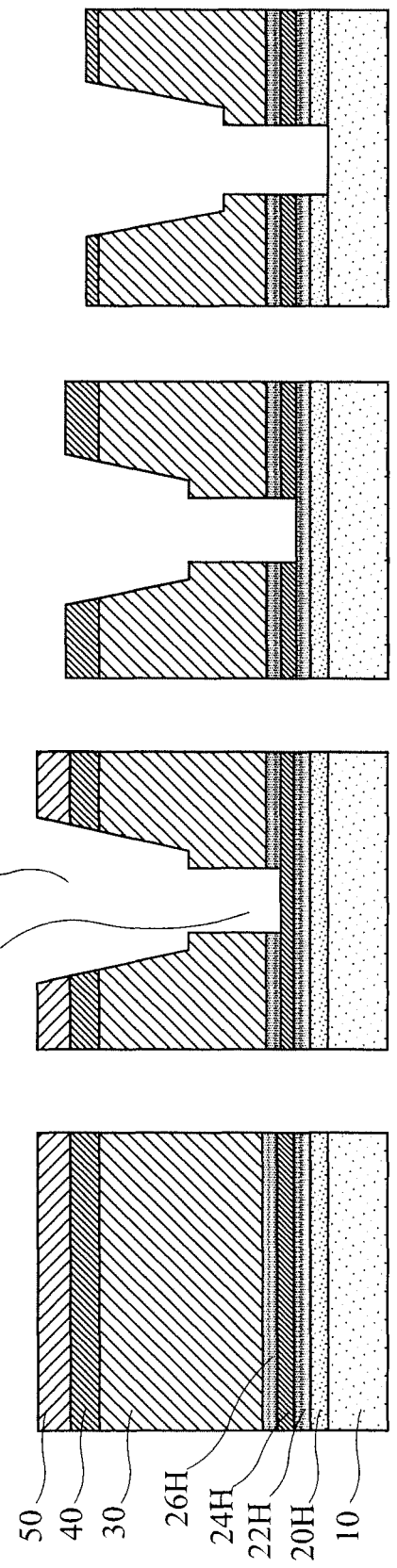

US 10,867,847 B2

SEMICONDUCTOR DEVICE AND MANUFACTURING METHOD THEREOF

CROSS-REFERENCE TO RELATED APPLICATIONS

This application is Divisional of U.S. application Ser. No. 15/063,358 filed on Mar. 7, 2016, which claims priority to U.S. Provisional Patent Application 62/273,366 filed Dec. 30, 2015, the entire disclosures of which are incorporated herein by reference.

TECHNICAL FIELD

The disclosure relates to a semiconductor integrated circuit, more particularly to a semiconductor device having metal layers formed by a dual damascene process.

BACKGROUND

As the semiconductor industry introduces new generations of integrated circuits (ICs) having higher performance and greater functionality, the density of the elements that form the ICs is increased, while the dimensions and spacing between components or elements of the ICs are reduced. The structure of metal wiring layers also becomes complex and minimized. To fabricate the metal wiring layers, a damascene process has been used together with a low-k (low dielectric constant being, e.g., 3.5 or lower) material.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D and 1E show exemplary sequential processes for manufacturing a metal wiring structure according to one embodiment of the present disclosure.

FIGS. 3A, 3B, 3C and 3D and 4A, 4B, 4C and 4D show exemplary sequential processes for manufacturing the metal wiring structure shown in FIG. 2A.

FIGS. 7A, 7B, 7C and 7D show exemplary sequential processes for manufacturing the metal wiring structure shown in FIG. 2D.

FIGS. 8A, 8B, 8C and 8D show exemplary sequential processes for manufacturing the metal wiring structure shown in FIG. 2E.

FIGS. 9A, 9B, 9C and 9D show exemplary sequential processes for manufacturing the metal wiring structure shown in FIG. 2F.

FIGS. 10A, 10B, 10C and 10D show exemplary sequential processes for manufacturing the metal wiring structure shown in FIG. 2G.

FIGS. 11A, 11B, 11C and 11D show exemplary sequential processes for manufacturing the metal wiring structure shown in FIG. 2H.

DETAILED DESCRIPTION

Figure 2A:
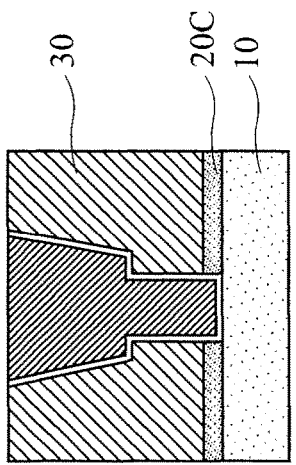
FIGS. 2A, 2B, 2C, 2D, 2E, 2F, 2G and 2H shows exemplary etch-stop layers according to various embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1A-1E show exemplary sequential processes for manufacturing a metal wiring structure according to one embodiment of the present disclosure. FIGS. 1A-1E illustrate exemplary sequential processes for fabricating one of metal wiring structures (wiring levels), which are formed above the underlying structure. The underlying structure includes a substrate, a contact to a transistor, or a lower level metal wiring structure, which constitute a semiconductor device. The detailed structure of the underlying structure may be omitted in FIGS. 1A-1E for simplicity.

As shown in FIG. 1A, an underlying structure 10 is formed over a substrate (not shown). In this embodiment, the underlying structure is a lower layer metal structure 10, which includes metal wirings extending in the first direction, e.g., the X direction. In some embodiments, the lower layer metal structure 10 includes of Cu or a Cu alloy. In some embodiments, a cap layer (not shown), which functions as a Cu diffusion barrier, is formed on the upper surface of the lower layer metal structure. The cap layer may include one or more of Co, Ni, Ru, Mo, CoWP and NiMoP.

An etch-stop layer (ESL) 20 is formed over the lower layer metal structure 10, followed by forming an interlayer dielectric (ILD) layer 30 over the ESL 20. An interlayer dielectric layer may also be called an inter-metal dielectric (IMD) layer. Further, a first mask layer 40 is formed over the ILD layer 30 and a second mask layer 50 is formed over the first mask layer 40.

The ESL 20 is a single layer of an insulating material or multiple layers of different insulating materials. In both cases, at least one layer is made of an aluminum-based insulating material, hafnium oxide, zirconium oxide or titanium oxide. The aluminum-based insulating material includes aluminum oxide, aluminum oxy-carbide (carbo-oxide) and aluminum oxy-nitride. In the present disclosure aluminum oxide is referred to as Alo, the aluminum oxy-carbide (carbo-oxide) is referred to as AlOC and the aluminum oxy-nitride is referred to as AlON. These materials may be stoichiometric or non-stoichiometric.

When the ESL 20 includes more than one layers (i.e., two or more sub-layers), at least one sub-layer is made of silicon based insulating material, such as silicon nitride, silicon carbo-oxide (oxy-carbide), silicon carbo-nitride, silicon oxy-nitride, silicon carbo-oxy-nitride, silicon carbide or silicon oxide. The silicon nitride is referred to as SiN, the silicon carbo-oxide (oxy-carbide) is referred to as SiCO, the silicon carbo-nitride is referred to as SiCN, the silicon oxy-nitride is referred to as SiON, the silicon carbo-oxy-nitride is referred to as SiCON, the silicon carbide is referred to as SiC, and the silicon oxide (dioxide) is referred to as SiO. These materials may be stoichiometric or non-stoichiometric.

The thickness of the ESL 20, when it is a single layer, is in a range from about 1 nm to about 10 nm in some embodiments, and is in a range from about 2 nm to 5 nm in other embodiments. When the ESL 20 include multiple sub-layers, the thickness of each of the sub-layers is in a range from about 2 nm to about 10 nm in some embodiments, and is in a range from about 3 nm to 6 nm in other embodiments.

The ILD layer 30 is made of, for example, one or more layers of low-k dielectric material. Low-k dielectric materials have a k-value (dielectric constant) lower than about 4.0. Some low-k dielectric materials have a k-value lower than about 3.5 and may have a k-value lower than about 2.5.

The materials for the ILD layer 30 include elements of Si, 0, C and/or H, such as SiCOH and SiOC. Organic material such as polymers or porous materials may be used for the ILD layer 30. For example, the ILD layer 30 is made of one or more layers of a carbon-containing material, organo-silicate glass, a porogen-containing material, and/or combinations thereof. Nitrogen may also be included in the ILD layer 30 in some embodiments. The density of the ILD layer 30 is less than about 3 g/cm$^3$ in one embodiment and may be less than about 2.5 g/cm$^3$ in other embodiments. The ILD layer 30 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

The thickness of the ILD layer 30 is in a range from about 10 nm to about 200 nm in some embodiments.

The first mask layer 40 is made of a dielectric material, such as the silicon based insulating materials. In one embodiment, SiO is used as the first mask layer 40. The thickness of the first mask layer 40 is in a range from about 10 nm to about 300 nm in some embodiments.

The second mask layer 50 is made of a metal based material, such as TiN, TaN, or TiO$_2$. The thickness of the second mask layer 50 is in a range from about 3 nm to about 100 nm in some embodiments.

As shown in FIG. 1B, a first opening 32 corresponding to a via hole pattern is formed by an appropriate patterning operation. In one embodiment, a photo resist pattern having an opening is formed on the second mask layer 50, and the second mask layer 50 is patterned by using the photo resist pattern as an etching mask. The photo resist pattern is removed after the second mask layer is etched. Then the first mask layer 40 is patterned by using the second mask layer 50 as an etching mask. In some embodiments, the photo resist pattern remains on the second mask layer 50 during the patterning of the first mask layer 40, and the photo resist pattern is removed after the first mask layer is etched.

Then, the ILD layer 30 is etched by using the patterned first and second mask layers as an etching mask. The patterning of the ILD layer 30 includes a dry etching.

In the present embodiment, the etching electivity of the ESL 20 with respect to the ILD layer 30 is set high. For example, an etching selectivity of the ESL 20 with respect to the ILD layer 30 during the ILD etching is about 3 or more in some embodiments, and is about 4 or more in other embodiments. In one embodiment, the etching selectivity of the ESL 20 with respect to the ILD layer 30 is in a range from about 4 to about 6. Since the etching electivity of the ESL 20 is high, the thickness of the ESL 20 can be thin, for example, less than about 5 nm. Accordingly, in the dry etching of the ILD layer 30, the ESL 20 is not substantially etched even after the surface of the ESL is exposed. In other words, the ESL 20 functions as an etch-stop layer for the ILD etching process.

Then, as shown in FIG. 1C, a second opening 34 corresponding to a wiring pattern is formed by an appropriate patterning operation. The patterning operations are substantially similar to the patterning operation for the first opening, and include a dry etching of the ILD layer 30. Similar to the etching of the ILD layer 30 for the opening 32, the ESL 20 functions as an etch-stop layer with a high etching electivity.

The order of the patterning operation of FIG. 1B and the patterning operation of FIG. 1C may be interchangeable.

After the second opening 34 is formed, the second mask layer 50 is removed by a wet etching operation. Further, the ESL 20 at the bottom of the opening 32 is removed by a dry etching operation, as shown in FIG. 1D. During this dry etching, the first mask layer 40 may also be etched, and the thickness of the first mask layer 40 may be reduced.

After the ESL 20 is etched, a second metal layer structure is formed, as shown in FIG. 1E. For example, the second metal layer structure includes a barrier layer 60 made of, for example, TiN, TaN or Cu and a body layer 70, which includes a via layer 72 and a wiring layer 74, made of, for example, Cu or Cu-based materials. The body layer 70 extends in the second direction (e.g., the Y direction) perpendicular to the first direction. The metal wiring structure may be made by a damascene process. A damascene process can be employed to form the second metal layer structure, which includes a chemical mechanical polishing (CMP) operation. By the CMP operation, the first mask layer 40 is removed. The body layer 70 is formed by CVD, physical vapor deposition (PVD) including sputtering, electro-chemical plating and/or electro-plating.

FIGS. 2A-2H shows exemplary etch-stop layers according to various embodiments of the present disclosure.

In FIG. 2A, the ESL 20 includes two sub-layers, a first sub layer 20A and a second sub-layer 22A. The first sub-layer 20A is formed on the lower metal wiring 10, and the second sub-layer 22A is formed on the first sub-layer 20A. The first sub-layer is made of one of Alo, AlOC, AlON, hafnium oxide, zirconium oxide and titanium oxide. The second sub-layer is made of a silicon based insulating material, such as SiCO, SiCN, SiC, SiO, SiON, SiCON or SiN.

Figure 2B:
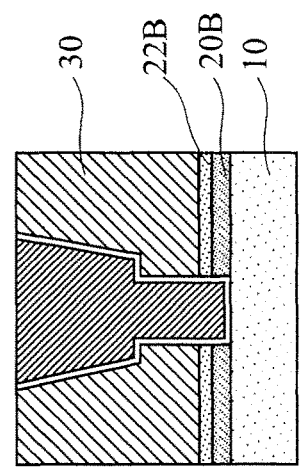

In FIG. 2B, the ESL 20 includes two sub-layers, a first sub layer 20B and a second sub-layer 22B. The first sub-layer 20B is formed on the lower metal wiring 10, and the second sub-layer 22B is formed on the first sub-layer 20B. The first sub-layer is made of a silicon based insulating material, such as SiCO, SiCN, SiC, SiO, SiON, SiCON or SiN. The second sub-layer is made of one of AlO, AlOC, AlON, hafnium oxide, zirconium oxide and titanium oxide.

Figure 2C:
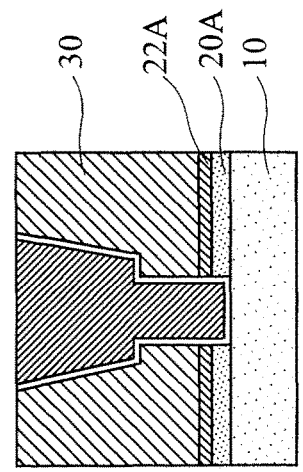

In FIG. 2C, the ESL 20 is a single layer 20C made of one of AlO, AlOC, AlON, hafnium oxide, zirconium oxide and titanium oxide.

Figure 2D:
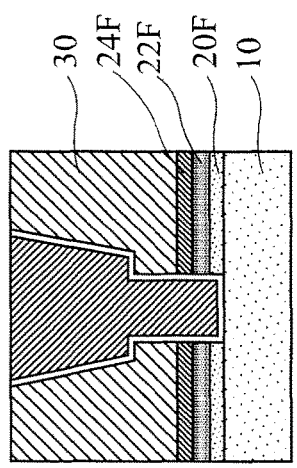

In FIG. 2D, the ESL 20 includes three sub-layers, a first sub layer 20D, a second sub-layer 22D and a third sub-layer 24D. The first sub-layer 20D is formed on the lower metal wiring 10, the second sub-layer 22D is formed on the first sub-layer 20D, and the third sub-layer 24D is formed on the second sub-layer 22D. The first and third sub-layers are made of one of AlO, AlOC, AlON, hafnium oxide, zirconium oxide and titanium oxide. The second sub-layer is made of silicon based insulating material, such as SiCO, SiCN, SiC, SiO, SiON, SiCON or SiN. The first and third sub-layers may be made of the same material or different materials. The sub-layer 20D may be two or more stacked layers all containing aluminum, without interposing any Si based insulating layer.

Figure 2E:
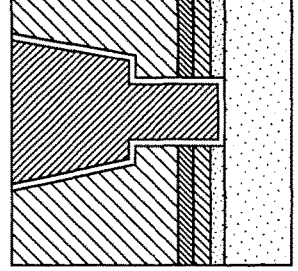

In FIG. 2E, the ESL 20 includes three sub-layers, a first sub layer 20E, a second sub-layer 22E and a third sub-layer 24E. The first sub-layer 20E is formed on the lower metal wiring 10, the second sub-layer 22E is formed on the first sub-layer 20E, and the third sub-layer 24E is formed on the second sub-layer 22E. The first sub-layer is made of one of AlO, AlOC, AlON, hafnium oxide, zirconium oxide and titanium oxide. The second and third sub-layers are made of silicon based insulating material, and the second sub-layer 22E is made of a different material from the third sub-layer 24E. The second sub-layer 22E is made of one of SiCN, SiON, SiCON and SiN, and the third sub-layer 24E is made of one of SiCO, SiC and SiO.

Figure 2F:
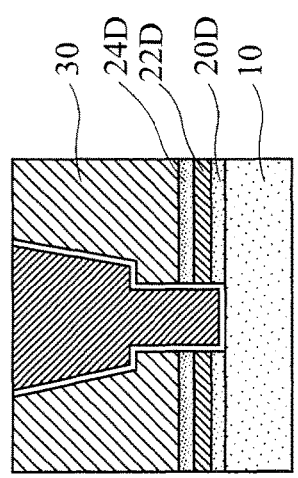

In FIG. 2F, the ESL 20 includes three sub-layers, a first sub layer 20F, a second sub-layer 22F and a third sub-layer 24F. The first sub-layer 20F is formed on the lower metal wiring 10, the second sub-layer 22F is formed on the first sub-layer 20F, and the third sub-layer 24F is formed on the second sub-layer 22F. The second sub-layer is made of one of AlO, AlOC, AlON, hafnium oxide, zirconium oxide and titanium oxide. The first and third sub-layers are made of silicon based insulating material, such as SiCO, SiCN, SiC, SiO, SiON, SiCON or SiN. The first and third sub-layers may be made of the same material or different materials.

Figure 2G:
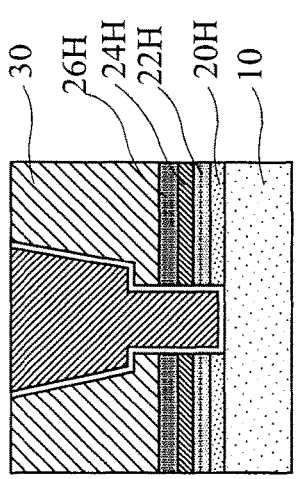

In FIG. 2G, the ESL 20 includes three sub-layers, a first sub layer 20G, a second sub-layer 22G and a third sub-layer 24G. The first sub-layer 20G is formed on the lower metal wiring 10, the second sub-layer 22G is formed on the first sub-layer 20G, and the third sub-layer 24G is formed on the second sub-layer 22G. The first and second sub-layers are made of silicon based insulating material, such as SiCO, SiCN, SiC, SiO, SiON, SiCON or SiN. The first and second sub-layers are be made of different materials. In some embodiments, the first sub-layer 20G is made of one of SiCO, SiC and SiO, and the second sub-layer 22G is made of one of SiCN, SiON, SiCON and SiN. The third sub-layer is made of one of AlO, AlOC, AlON, hafnium oxide, zirconium oxide and titanium oxide.

Figure 2H:
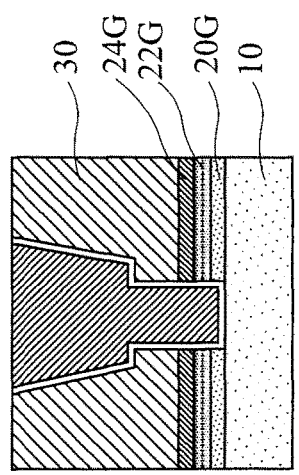

In FIG. 2H, the ESL 20 includes four sub-layers, a first sub layer 20H, a second sub-layer 22H, a third sub-layer 24H and a fourth sub-layer 26H. The first sub-layer 20H is formed on the lower metal wiring 10, the second sub-layer 22H is formed on the first sub-layer 20H, the third sub-layer 24H is formed on the second sub-layer 22H and the fourth sub-layer 26H is formed on the third sub-layer 24H. The first and third sub-layers are made of one of AlO, AlOC, AlON, hafnium oxide, zirconium oxide and titanium oxide. The second and fourth sub-layers are made of silicon based insulating material, such as SiCO, SiCN, SiC, SiO, SiON, SiCON or SiN. The first and third sub-layers may be made of the same material or different materials, and the second and fourth sub-layers may be made of the same material or different materials.

The aluminum-based insulating material, such as AlO, AlOC and AlON may be formed by the following operations. First, an aluminum layer is formed on the underlying layer (e.g., the lower layer metal structure or another sub-layer of the ESL 20). The aluminum layer is formed by, for example, metal-organic CVD (MOCVD) or ALD using tri-methyl-aluminum (TMA). Then, a plasma treatment using $NH_3$, $CO_2$ and/or CO gases is performed over the aluminum layer, to convert the aluminum layer into AlO, AlOC or AlON. The concentrations of Al, O, C and/or N in the plasma treated aluminum layer are not uniform, in particular, along the vertical direction. The AlON layer may be made of two layers of AlO and AlN. In some embodiments, a thin layer of aluminum having a thickness of less than about 1 nm remains at the bottom of the layer. A chemical oxidation of the aluminum layer using an oxidation solution may be employed. In some embodiments, the AlO, AlOC or AlON layer can be directly formed by CVD, PVD or ALD by using appropriate source gases.

The hafnium oxide, zirconium oxide and titanium oxide can be formed by the similar method as set forth above, or CVD, PVD or ALD, or other suitable film forming methods by using appropriate source gases.

FIGS. 3A-3D show exemplary sequential processes for manufacturing the metal wiring structure shown in FIG. 2A according to one embodiment of the present disclosure.

Similar to FIG. 1A, an ESL including a first sub-layer 20A and the second sub-layer 22A is formed on the lower metal wiring 10. The first-sub layer 20A is formed on the lower metal wiring 10, and the second sub-layer 22A is formed on the first sub-layer 20A. Further, an ILD layer 30 is formed on the second sub-layer 22A and first and second mask layer 40, 50 are formed on the ILD layer 30, as shown in FIG. 3A.

Similar to FIGS. 1B and 1C, the opening 32 and 34 are formed by etching the ILD layer 30, as shown in FIG. 3B. In the etching of the ILD layer 30, the second sub-layer 22A is etched, while the first sub-layer 20A functions as an etch-stop layer.

Subsequently, the second mask layer 50 is removed by a wet etching process, as shown in FIG. 3C. In the wet etching process, the first sub-layer 20A is not substantially etched.

Similar to FIG. 1D, the first sub-layer 20A is etched by a dry etching process, as shown in FIG. 3D. Subsequently, similar to FIG. 1E, the second metal structure is formed in the opening.

FIGS. 4A-4D show exemplary sequential processes for manufacturing the metal wiring structure shown in FIG. 2A according to another embodiment of the present disclosure.

Similar to FIG. 1A, an ESL including a first sub-layer 20A and the second sub-layer 22A is formed on the lower metal wiring 10. The first-sub layer 20A is formed on the lower metal wiring 10, and the second sub-layer 22A is formed on the first sub-layer 20A. Further, an ILD layer 30 is formed on the second sub-layer 22A and first and second mask layer 40, 50 are formed on the ILD layer 30, as shown in FIG. 4A.

Similar to FIGS. 1B and 1C, the opening 32 and 34 are formed by etching the ILD layer 30, as shown in FIG. 4B. In the etching of the ILD layer 30, the second sub-layer 22A functions as an etch-stop layer.

Subsequently, the second mask layer 50 is removed by a wet etching process, as shown in FIG. 4C. In the wet etching process, the second sub-layer 22A is not substantially etched.

Similar to FIG. 1D, the second sub-layer 22A and the first sub-layer 20A are etched by a dry etching process, as shown in FIG. 4D. Subsequently, similar to FIG. 1E, the second metal structure is formed in the opening.

FIGS. 5A-5D show exemplary sequential processes for manufacturing the metal wiring structure shown in FIG. 2B according to another embodiment of the present disclosure.

Figure 5D:
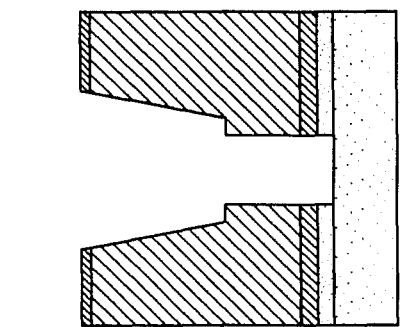
FIGS. 5A, 5B, 5C and 5D show exemplary sequential processes for manufacturing the metal wiring structure shown in FIG. 2B.
Figure 5C:
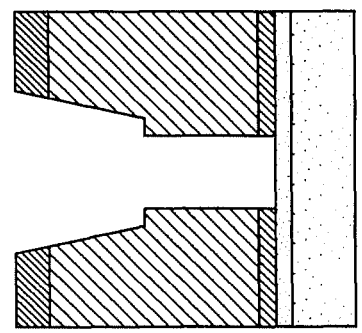

Similar to FIG. 1A, an ESL including a first sub-layer 20B and the second sub-layer 22B is formed on the lower metal wiring 10. The first-sub layer 20B is formed on the lower metal wiring 10, and the second sub-layer 22B is formed on the first sub-layer 20B. Further, an ILD layer 30 is formed on the second sub-layer 22B and first and second mask layer 40, 50 are formed on the ILD layer 30, as shown in FIG. 5A.

Figure 5B:
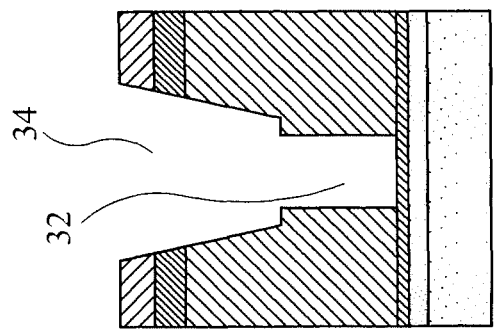
Figure 5A:
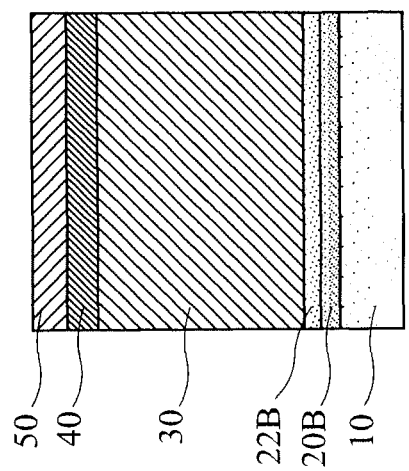

Similar to FIGS. 1B and 1C, the opening 32 and 34 are formed by etching the ILD layer 30, as shown in FIG. 5B. In the etching of the ILD layer 30, the second sub-layer 22B functions as an etch-stop layer.

Subsequently, the second mask layer 50 is removed by a wet etching process, as shown in FIG. 5C. In the etching process of the second mask layer 50, the second sub-layer 22B is also removed.

Similar to FIG. 1D, the first sub-layer 20B is etched by a dry etching process, as shown in FIG. 5D. Subsequently, similar to FIG. 1E, the second metal structure is formed in the opening.

FIGS. 6A-6D show exemplary sequential processes for manufacturing the metal wiring structure shown in FIG. 2C according to another embodiment of the present disclosure.

Figure 6D:
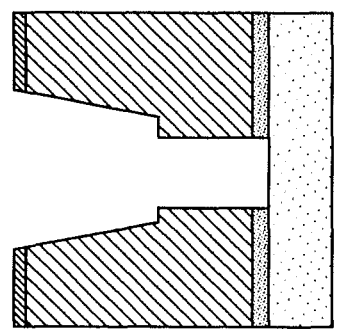
FIGS. 6A, 6B, 6C and 6D show exemplary sequential processes for manufacturing the metal wiring structure shown in FIG. 2C.
Figure 6C:
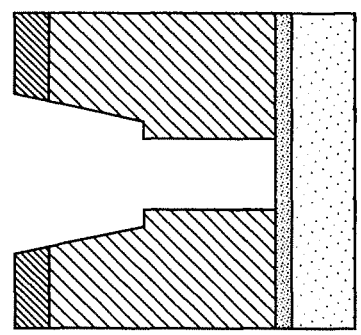

Similar to FIG. 1A, an ESL of a first sub-layer 20C is formed on the lower metal wiring 10. Further, an ILD layer 30 is formed on the second sub-layer 22B and first and second mask layer 40, 50 are formed on the ILD layer 30, as shown in FIG. 6A.

Figure 6B:
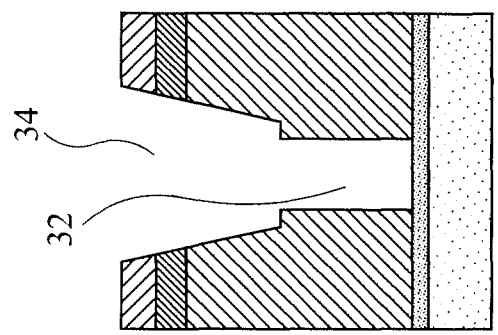
Figure 6A:
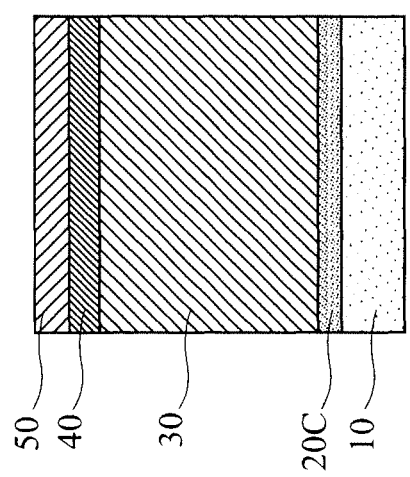

Similar to FIGS. 1B and 1C, the opening 32 and 34 are formed by etching the ILD layer 30, as shown in FIG. 6B. In the etching of the ILD layer 30, the first sub-layer 20C functions as an etch-stop layer.

Subsequently, the second mask layer 50 is removed by a wet etching process and/or a dry etching process, as shown in FIG. 6C. In the etching process of the second mask layer 50, the first sub-layer 20C is not substantially etched.

Similar to FIG. 1D, the first sub-layer 20C is etched by a dry etching process, as shown in FIG. 6D. Subsequently, similar to FIG. 1E, the second metal structure is formed in the opening.

FIGS. 7A-7D show exemplary sequential processes for manufacturing the metal wiring structure shown in FIG. 2D according to another embodiment of the present disclosure.

Similar to FIG. 1A, an ESL including a first sub-layer 20D, the second sub-layer 22D and the third sub-layer 24D is formed on the lower metal wiring 10. The first-sub layer 20D is formed on the lower metal wiring 10, the second sub-layer 22D is formed on the first sub-layer 20D and the third sub-layer 24D is formed on the second sub-layer 22D. Further, an ILD layer 30 is formed on the third sub-layer 24D and first and second mask layer 40, 50 are formed on the ILD layer 30, as shown in FIG. 7A.

Similar to FIGS. 1B and 1C, the opening 32 and 34 are formed by etching the ILD layer 30, as shown in FIG. 7B. In the etching of the ILD layer 30, the third sub-layer 24D functions as an etch-stop layer.

Subsequently, the second mask layer 50 is removed by a wet etching process, as shown in FIG. 7C. In the etching process of the second mask layer 50, the third sub-layer 24D is also removed.

Similar to FIG. 1D, the second sub-layer 22D and the first sub-layer 20D are etched by a dry etching process, as shown in FIG. 7D. Subsequently, similar to FIG. 1E, the second metal structure is formed in the opening.

FIGS. 8A-8D show exemplary sequential processes for manufacturing the metal wiring structure shown in FIG. 2E according to another embodiment of the present disclosure.

Similar to FIG. 1A, an ESL including a first sub-layer 20E, the second sub-layer 22E and the third sub-layer 24E is formed on the lower metal wiring 10. The first-sub layer 20E is formed on the lower metal wiring 10, the second sub-layer 22E is formed on the first sub-layer 20E and the third sub-layer 24E is formed on the second sub-layer 22E. Further, an ILD layer 30 is formed on the third sub-layer 24E and first and second mask layer 40, 50 are formed on the ILD layer 30, as shown in FIG. 8A.

Similar to FIGS. 1B and 1C, the opening 32 and 34 are formed by etching the ILD layer 30, as shown in FIG. 8B. In the etching of the ILD layer 30, the third sub-layer 24E is etched, while the second sub-layer 24E functions as an etch-stop layer.

Subsequently, the second mask layer 50 is removed by a wet etching process and/or a dry etching process, as shown in FIG. 8C. In the etching process of the second mask layer 50, the second sub-layer 22E is not substantially etched.

Similar to FIG. 1D, the second sub-layer 22E and the first sub-layer 20E are etched by a dry etching process, as shown in FIG. 8D. Subsequently, similar to FIG. 1E, the second metal structure is formed in the opening.

FIGS. 9A-9D show exemplary sequential processes for manufacturing the metal wiring structure shown in FIG. 2F according to another embodiment of the present disclosure.

Similar to FIG. 1A, an ESL including a first sub-layer 20F, the second sub-layer 22F and the third sub-layer 24F is formed on the lower metal wiring 10. The first-sub layer 20F is formed on the lower metal wiring 10, the second sub-layer 22F is formed on the first sub-layer 20F and the third sub-layer 24F is formed on the second sub-layer 22F. Further, an ILD layer 30 is formed on the third sub-layer 24F and first and second mask layer 40, 50 are formed on the ILD layer 30, as shown in FIG. 9A.

Similar to FIGS. 1B and 1C, the opening 32 and 34 are formed by etching the ILD layer 30, as shown in FIG. 9B. In the etching of the ILD layer 30, the third sub-layer 24F is etched, while the second sub-layer 24F functions as an etch-stop layer.

Subsequently, the second mask layer 50 is removed by a wet etching process and/or a dry etching process, as shown in FIG. 9C. In the etching process of the second mask layer 50, the second sub-layer 22F is also etched, while the first sub-layer 20F is not substantially etched.

Similar to FIG. 1D, the first sub-layer 20F is etched by a dry etching process, as shown in FIG. 9D. Subsequently, similar to FIG. 1E, the second metal structure is formed in the opening.

FIGS. 10A-10D show exemplary sequential processes for manufacturing the metal wiring structure shown in FIG. 2G according to another embodiment of the present disclosure.

Similar to FIG. 1A, an ESL including a first sub-layer 20G, the second sub-layer 22G and the third sub-layer 24G is formed on the lower metal wiring 10. The first-sub layer 20G is formed on the lower metal wiring 10, the second sub-layer 22G is formed on the first sub-layer 20G and the third sub-layer 24G is formed on the second sub-layer 22G. Further, an ILD layer 30 is formed on the third sub-layer 24G and first and second mask layer 40, 50 are formed on the ILD layer 30, as shown in FIG. 10A.

Similar to FIGS. 1B and 1C, the opening 32 and 34 are formed by etching the ILD layer 30, as shown in FIG. 10B. In the etching of the ILD layer 30, the third sub-layer 24G functions as an etch-stop layer.

Subsequently, the second mask layer 50 is removed by a wet etching process and/or a dry etching process, as shown in FIG. 10C. In the etching process of the second mask layer 50, the third sub-layer 24G is also etched, while the second sub-layer 22G is not substantially etched.

Similar to FIG. 1D, the second sub-layer 22G and the first sub-layer 20G are etched by a dry etching process, as shown in FIG. 10D. Subsequently, similar to FIG. 1E, the second metal structure is formed in the opening.

FIGS. 11A-11D show exemplary sequential processes for manufacturing the metal wiring structure shown in FIG. 2H according to another embodiment of the present disclosure.

Similar to FIG. 1A, an ESL including a first sub-layer 20H, the second sub-layer 22H, the third sub-layer 24H and the fourth sub-layer 26H is formed on the lower metal wiring 10. The first-sub layer 20H is formed on the lower metal wiring 10, the second sub-layer 22H is formed on the first sub-layer 20H, the third sub-layer 24H is formed on the second sub-layer 22H and the fourth sub-layer 26H is formed on the third sub-layer 24H. Further, an ILD layer 30 is formed on the fourth sub-layer 26H and first and second mask layer 40, 50 are formed on the ILD layer 30, as shown in FIG. 11A.

Similar to FIGS. 1B and 1C, the opening 32 and 34 are formed by etching the ILD layer 30, as shown in FIG. 11B. In the etching of the ILD layer 30, the fourth sub-layer 26H is also etched, while the third sub-layer 24H functions as an etch-stop layer.

Subsequently, the second mask layer 50 is removed by a wet etching process and/or a dry etching process, as shown in FIG. 11C. In the etching process of the second mask layer 50, the third sub-layer 24H is also etched, while the second sub-layer 22H is not substantially etched.

Similar to FIG. 1D, the second sub-layer 22H and the first sub-layer 20H are etched by a dry etching process, as shown in FIG. 11D. Subsequently, similar to FIG. 1E, the second metal structure is formed in the opening.

The various embodiments or examples described herein offer several advantages over the existing art, as set forth above. For example, in the present disclosure, by using an etch-stop layer including at least one sub-layer made of an aluminum-based insulating material, hafnium oxide, zirconium oxide or titanium oxide, a broader process margin for the etching of the ILD layer can be obtained. Further, since the etching selectivity of these materials is relatively high, the thickness of the etch-stop layer can be reduced, which can reduce a capacitance in the interconnect layers.

It will be understood that not all advantages have been necessarily discussed herein, no particular advantage is required for all embodiments or examples, and other embodiments or examples may offer different advantages.

In accordance with one aspect of the present disclosure, a semiconductor device includes a first metal wiring layer, an interlayer insulating layer formed over the first metal layer, a second metal wiring structure, and an etch-stop layer. A second metal wiring structure is embedded in the interlayer dielectric layer and is connected to the first metal wiring layer. The etch-stop layer is disposed between the first metal wiring and the first interlayer dielectric layer, and includes one or more sub-layers. The etch-stop layer includes a first sub-layer made of an aluminum-based insulating material, hafnium oxide, zirconium oxide or titanium oxide.

In accordance with another aspect of the present disclosure, in the method for manufacturing a semiconductor device, a first metal wiring layer is formed. An etch-stop layer is formed over the first metal wiring layer. An interlayer insulating layer is formed on the etch-stop layer. A mask layer is formed on the interlayer insulating layer. An opening is formed by etching the interlayer insulating layer. A second metal layer is formed in the opening. The etch-stop layer includes a first sub-layer made of at least one of aluminum oxide, aluminum oxy-carbide and aluminum oxy-nitride. The etching for forming the opening includes a first etching process for etching the interlayer dielectric layer and a second etching process performed after the first etching process to expose the first metal wiring layer. The first sub-layer functions as an etch-stop layer for first etching process.

In accordance with another aspect of the present disclosure, in the method for manufacturing a semiconductor device, a first metal wiring layer is formed. An etch-stop layer is formed over the first metal wiring layer. An interlayer insulating layer is formed on the etch-stop layer. A mask layer is formed on the interlayer insulating layer. An opening is formed by etching the interlayer insulating layer. A second metal layer is formed in the opening. The etch-stop layer includes a first sub-layer made of at least one of aluminum oxide, aluminum oxy-carbide and aluminum oxy-nitride and a second sub-layer made of a silicon based insulating material. The etching for forming the opening includes a first etching process for etching the interlayer dielectric layer and a second etching process performed after the first etching process to expose the first metal wiring layer. The second sub-layer functions as an etch-stop layer for first etching process.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first metal wiring layer;
   forming an etch-stop layer over the first metal wiring layer;
   forming an interlayer dielectric layer on the etch-stop layer;
   forming a mask layer on the interlayer dielectric layer;
   forming an opening by etching the interlayer dielectric layer; and
   forming a second metal layer in the opening, wherein:
   the etch-stop layer consists of, in an order closer to the first metal wiring layer, a first sub-layer made of one selected from the group consisting of an aluminum-based insulating material, hafnium oxide, zirconium oxide and titanium oxide, a second sub-layer made of a first silicon based insulating material, and a third sub-layer made of a second silicon based insulating material different from the first silicon based insulating material, and the forming the opening includes a first dry etching process for etching the interlayer dielectric layer and the third sub-layer, which stops on the second sub-layer, and a second dry etching process performed after the first etching process to expose the metal wiring layer.

2. The method of claim 1, wherein the first sub-layer in in direct contact with the first metal wiring and the third sub-layer is in direct contact with the interlayer dielectric layer.

3. The method of claim 1, wherein the first sub-layer is made of at least one of aluminum oxide, aluminum oxy-carbide and aluminum oxy-nitride.

4. The method of claim 1, wherein the first sub-layer is made of at least one selected from the group consisting of aluminum oxy-carbide and aluminum oxy-nitride having a non-uniform nitrogen concentration in a thickness direction, and aluminum oxy-carbide having a non-uniform carbon concentration in the thickness direction.

5. The method of claim 4, wherein the second silicon based insulating material includes one selected from the group consisting of SiCO, SiC and SiO.

6. The method of claim 5, wherein the first silicon based insulating material includes one selected from the group consisting of SiCN, SiON, SiCON and SiN.

7. The method of claim 1, wherein a thickness of the etch stop layer is in a range from 2 nm to 10 nm.

8. The method of claim 1, wherein the first sub-layer is made of one selected from the group consisting of zirconium oxide and titanium oxide.

9. The method of claim 4, wherein the aluminum oxy-nitride having a non-uniform nitrogen concentration in a thickness direction is formed by plasma treatment using an $NH_3$ gas on an aluminum layer, and the aluminum oxy-carbide having a non-uniform carbon concentration in the thickness direction is formed by plasma treatment using at least one of $CO_2$ and CO gases on the aluminum layer.

10. The method of claim 9, wherein the aluminum layer is formed by atomic layer deposition using tri-methyl-aluminum as a source gas.

11. The method of claim 1, wherein: the second metal layer includes a bottom part and an upper part, a step is formed between the bottom part and the upper part, and the upper part is tapered, while the bottom part has no tapered shape.

12. A method for manufacturing a semiconductor device, comprising:
forming a first metal wiring layer;
forming an etch-stop layer over the first metal wiring layer;
forming an interlayer dielectric layer on the etch-stop layer;
forming a mask layer on the interlayer dielectric layer, the mask layer including a first mask layer disposed on the interlayer dielectric layer and a second mask layer disposed on the first mask layer;
forming an opening by etching the interlayer dielectric layer; and
forming a second metal layer in the opening, wherein:
the etch-stop layer consists of, in an order closer to the first metal wiring layer, a first sub-layer made of one selected from the group consisting of an aluminum-based insulating material, hafnium oxide, zirconium oxide and titanium oxide, a second sub-layer made of a first silicon based insulating material, and a third sub-layer made of a second silicon based insulating material different from the first silicon based insulating material, the first mask layer is made of a metal-based material and the second mask layer is made of a dielectric material, the forming the opening includes a first dry etching process for etching the interlayer dielectric layer and the third sub-layer, which stops on the second sub-layer, a first mask removing process to remove the second mask layer, and after the first mask removing process, a second dry etching process performed after the first dry etching process to expose the metal wiring layer.

13. The method of claim 12, wherein the second mask layer includes at least one selected from the group consisting of TiN, TaN and $TiO_2$.

14. The method of claim 12, wherein the first mask removing process includes a wet etching process.

15. The method of claim 12, wherein the first sub-layer is aluminum oxynitride, the second sub-layer is SiCN and the third sub-layer is SiCO.

16. The method of claim 12, further comprising a second mask removing process to remove the first mask layer.

17. The method of claim 16, the second mask removing process includes a chemical mechanical polishing process.

18. A method of manufacturing a semiconductor device, comprising:
forming a first insulating layer in direct contact with a metal layer;
forming a second insulating layer in direct contact with the first insulating layer;
forming a third insulating layer in direct contact with the second insulating layer;
forming an interlayer dielectric layer in direct contact with the third insulating layer;
performing a first patterning operation including a lithography operation and an dry etching operation to form a first opening passing through the interlayer dielectric layer; and
performing a second patterning operation including a lithography operation and an dry etching operation to form a second opening at an upper portion of the interlayer dielectric layer, wherein:
the first insulating layer is made of one selected from the group consisting of an aluminum-based insulating material, hafnium oxide, zirconium oxide and titanium oxide,
the second insulating layer is made of a first silicon based insulating material,
the third insulating layer is made of a second silicon based insulating material different from the first silicon based insulating material,
the interlayer dielectric layer is made of a low-k dielectric material having a k-value lower than about 4.0, and
the second opening has a tapered shape.

19. The method of claim 18, wherein the second insulating layer is etched by the first patterning operation.

20. The method of claim 18, wherein the first insulating layer is made of one selected from the group consisting of zirconium oxide and titanium oxide.

* * * * *